(12) United States Patent
Mheen et al.

(10) Patent No.: US 8,338,868 B2
(45) Date of Patent: Dec. 25, 2012

(54) SHARED PHOTODIODE IMAGE SENSOR

(75) Inventors: Bong Ki Mheen, Daejeon (KR); Albert J. P. Theuwissen, Delft (NL); Jae Sik Sim, Daejeon (KR); Mi Ran Park, Daejeon (KR); Yong Hwan Kwon, Daejeon (KR); Eun Soo Nam, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 323 days.

(21) Appl. No.: 12/626,343

(22) Filed: Nov. 25, 2009

(65) Prior Publication Data
US 2010/0133590 A1    Jun. 3, 2010

(30) Foreign Application Priority Data

Dec. 3, 2008    (KR) ..................... 10-2008-0121949
May 18, 2009    (KR) ..................... 10-2009-0043174

(51) Int. Cl.
*H01L 31/062* (2012.01)
*H01L 31/113* (2006.01)

(52) U.S. Cl. ........ 257/292; 257/232; 257/222; 257/223; 257/233; 257/204

(58) Field of Classification Search ............... 257/292, 257/232, 222, 233, 204, 291, 369, 445, 447, 257/458, 53; 350/208.1
See application file for complete search history.

(56) References Cited

U.S. PATENT DOCUMENTS

| | | | |
|---|---|---|---|
| 6,107,655 A | 8/2000 | Guidash | |
| 6,552,322 B1 | 4/2003 | Campbell et al. | |
| 6,838,653 B2 | 1/2005 | Campbell et al. | |
| 7,244,918 B2 | 7/2007 | McKee et al. | |
| 2007/0177044 A1* | 8/2007 | Maruyama et al. | 348/308 |
| 2007/0257280 A1* | 11/2007 | Hynecek | 257/225 |
| 2007/0257286 A1* | 11/2007 | Hynecek | 257/292 |
| 2010/0033610 A1* | 2/2010 | Hynecek | 348/301 |

FOREIGN PATENT DOCUMENTS

| | | | |
|---|---|---|---|
| KR | 2005-0031724 A | 4/2005 | |
| KR | 2005-0100466 A | 10/2005 | |
| KR | 2006-0087814 A | 8/2006 | |
| KR | 2007-0075629 A | 7/2007 | |

OTHER PUBLICATIONS

Hyuck In Kwon et al., "The analysis of dark signals in the CMOS APS imagers from the characterization of test structures", IEEE Transactions on Electron Devices, Feb. 2004, vol. 51, No. 2, pp. 178-184. Hyuck In Kwon et al., "The effects of deuterium annealing on the reduction of dark currents in the CMOS APS", IEEE Transactions on Electron Devices, Aug. 2004, vol. 51, No. 8, pp. 1346-1349.

Mori, M. et al., "¼-inch 2-mpixel MOS image sensor with 1.75 transistors/pixel", IEEE Journal of Solid-State Circuits, Dec. 2004, vol. 39, No. 12, pp. 2426-2430.

Teranishi, N. et al., "An interline CCD image sensor with reduced image lag", IEEE Transactions on Electron Devices, Dec. 1984, vol. 31, No. 12, pp. 1829-1833.

* cited by examiner

*Primary Examiner* — Telly Green
(74) *Attorney, Agent, or Firm* — Rabin & Berdo, P.C.

(57) ABSTRACT

An image sensor with a shared photodiode is provided. The image sensor includes at least two unit pixels, each of which includes a photodiode, a diffusion region which gathers electrons from the photodiode, a transfer transistor which connects the photodiode with the diffusion region, and a readout circuit which reads out a signal from the diffusion region. Photodiodes of neighboring unit pixels are disposed symmetrically to be adjacent to one another to form a shared photodiode. The image sensor does not have a STI region which causes a dark current restricting its performance and does not require a basic minimum design factor (a distance or an area) related to a STI region. A region corresponding to a STI region may be used as a region of a photodiode or for additional pixel scaling. Therefore, a limitation in scaling of a photodiode is overcome, and pixel performance is improved in spite of pixel scaling.

15 Claims, 9 Drawing Sheets

SHARED PHOTODIODE IMAGE SENSOR

CROSS-REFERENCE TO RELATED APPLICATION

This application claims priority to and the benefit of Korean Patent Application Nos. 10-2008-0121949, filed Dec. 3, 2008 and 10-2009-0043174, filed May 18, 2009, the disclosure of which is incorporated herein by reference in its entirety.

BACKGROUND

1. Field of the Invention

The present invention relates to an image sensor, and more particularly, to an image sensor with a shared photodiode structure.

2. Discussion of Related Art

Photoelectric conversion of a unit pixel which configures an image sensor is commonly performed in a photodiode.

In particular, in a silicon process, a photodiode with an excellent dark current characteristic has a high signal to noise ratio (SNR).

In the case of an image sensor in which one pixel includes four transistors, in order to reduce a dark current, a technique of doping ions into a surface of a photodiode to reduce influence from a surface inspection of a photodiode and preventing a dark current from being generated from such an inspection even in a situation in which a photodiode is reversely biased to a high voltage is used. The technique greatly reduces a dark current, and thus an image which has as high SNR as a charged-coupled device (CCD) can be obtained.

However, the technique is limited to an effort of improving a dark current characteristic in a vertical surface, and thus there is a need for an effort of suppressing a dark current in scaling of a vertical surface.

SUMMARY OF THE INVENTION

The present invention is directed to a method of not only securing a space for pixel scaling or photodiode expansion but also preventing a dark current from being generated.

The present invention is also directed to a method of simultaneously driving two or more neighboring transfer transistors to thereby improve a resolution.

An aspect of the present invention provides an image sensor with a shared photodiode, including: at least two unit pixels, each of which includes a photodiode, a diffusion region which gathers electrons from the photodiode, a transfer transistor which connects the photodiode with the diffusion region, and a readout circuit which reads out a signal from the diffusion region, wherein photodiodes of neighboring unit pixels are disposed symmetrically to be adjacent to one another to form a shared photodiode, and a detection signal is generated when a turn on signal is simultaneously applied to transfer transistors connected to the shared photodiode.

Transfer transistors of the neighboring unit pixels with respect to the shared photodiode may be disposed symmetrically centering on the shared photodiode.

The shared photodiode may be formed such that photodiodes of four neighboring unit pixels are disposed symmetrically to be adjacent to one another, and four transfer transistors are disposed symmetrically centering on the shared photodiode.

The shared photodiode may have a diamond shape, and the transfer transistors may be positioned at corner regions of the diamond shape, respectively.

Readout signals from neighboring shared photodiodes may be combined to generate one detection signal.

The detection signal may correspond to a sum of the readout signals from the neighboring shared photodiodes.

The shared photodiode may be formed through one mask region.

The image sensor may further include a separation wall which forms an energy barrier on the shared photodiode.

The separation wall may be formed by forming a wiring on the shared photodiode, and an energy barrier is formed when a voltage is applied to the wiring.

The separation wall may form an energy barrier in the shared photodiode through an ion-doped separation region.

The wiring may include a metallic line or a poly wiring.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

Hereinafter, exemplary embodiments of the present invention will be described in detail. However, the present invention is not limited to the embodiments disclosed below, but can be implemented in various forms. The following embodiments are described in order for this disclosure to be complete and enabling to those of ordinary skill in the art.

Figure 1:
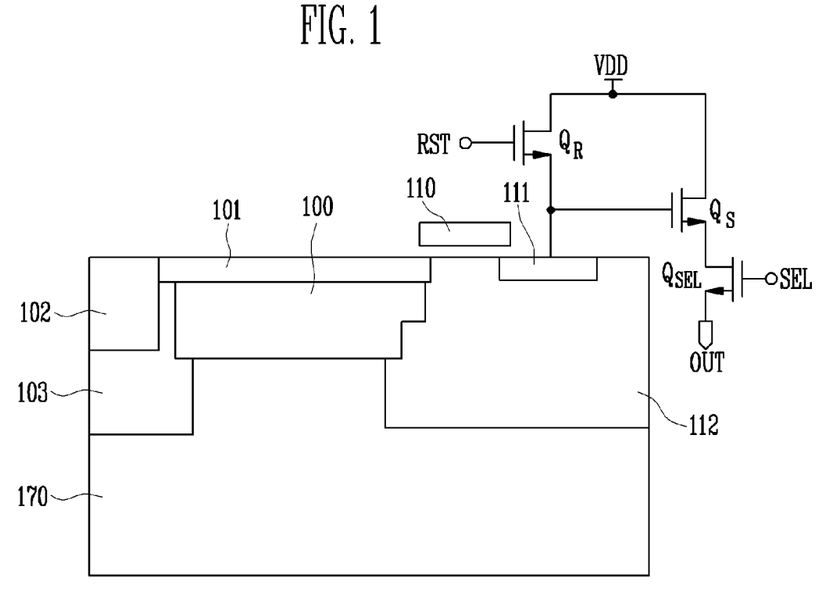
FIG. 1 is a cross-sectional view illustrating a unit pixel of a conventional image sensor which includes four transistors.

FIG. 1 is a cross-sectional view illustrating a unit pixel of a conventional image sensor which includes four transistors.

Referring to FIG. 1, a surface implanting region 101, a shallow trench isolation (STI) region 102, a p-type doped region 103 for preventing a defective trap of the STI region 102 from generating a dark current in the photodiode 100, and a p-well region 112 on which transistors which configure a signal readout circuit are disposed are formed around the photodiode 100 formed on a p-type substrate 170.

The signal readout circuit includes a transfer transistor 110 which connects the photodiode 100 with a diffusion region 111, a reset transistor QR which is connected between the diffusion region 111 and a reference voltage VDD and resets the diffusion region 111 and the photodiode 100, a driving transistor QS which serves as a source follower, and a selection transistor QSEL which reads out a signal of the corresponding photodiode 100 according to a selection signal SEL.

Incident light is divided into electron hole pairs (EHPs). At this time, electrons are stored in the photodiode 100 which is previously reset and completely depleted.

Thereafter, when the transfer transistor 100 is turned on, is accumulated electrons move to the diffusion region 111, and a voltage generated in the diffusion region 111 is transferred to an output node OUT through the driving transistor QS and the selection transistor QSEL.

The photodiode 100 is initially reset when the reset transistor QR is turned on, and drains of the reset transistor QR and the driving transistor QS are connected to the reference voltage VDD.

Generally, in a process of manufacturing a CMOS-type image sensor, a STI region is used to separate or isolate elements or photodiodes from each other. Such a STI region has an imperfect surface due to a process characteristic.

In the event that depletion is expanded to a STI region in a reset condition (a reversely biased situation) of the photodiode 100, a dark current abruptly increases. In order to suppress such a phenomenon, p+ ions may be doped into an area around the STI region 102, but it is more important to keep a sufficient distance between the STI region 102 and the photodiode 100.

A separation distance may be reduced by process improvement. However, in recent pixel scaling, the separation distance and a minimum width of the STI region 102 which is present between the photodiodes 100 are considered, and thus their rate is very high.

Therefore, it is undesirable to reduce only the size of the is photodiode 100 through pixel scaling, and a fill factor gets worse due to pixel scaling.

Further, as a method of improving a characteristic of an image sensor, an attempt at sharing a readout circuit which reads out a signal of the corresponding photodiode 100 without reducing the size of the photodiode 100 through pixel scaling has been made. In this case, since the readout circuit is shared, pixel scaling can be performed without reducing the size of the photodiode 100, and a characteristic of an image sensor can be improved by adding a photodiode to the shared readout circuit without performing the whole pixel scaling.

However, such a technique of sharing the readout circuit has a poor photodiode characteristic in a situation in which a photodiode has to be further scaled.

Image sensors which require a high SNR and a low noise characteristic commonly have a large-sized photodiode.

This is because a rate at which a photodiode occupies one pixel, that is, a fill factor, increases, and thus quantum efficiency is improved.

A pixel of a four-transistor structure with a pinned photodiode shows a very excellent low noise characteristic.

In the case of the four-transistor structure, the transfer transistor 110 shown in FIG. 1 play a very important role in resetting the pinned photodiode or transferring photo-electrons accumulated. However, when a distance between the photodiode 100 and the transfer transistor 110 is long (or when the size of the photodiode is increased), reset and transfer operations are not smoothly performed, and an operation noise abruptly increases. Therefore, a SNR abruptly deteriorates in low intensity of illumination.

For pixel scaling for a structure of FIG. 1, transistors in a pixel are reduced in size or changed in arrangement, but recently, there is a case in which a photodiode is scaled. There is a limitation to reducing a distance between the STI region 102 and the photodiode 100 since a dark current may increase. For this reason, there is a problem in that the size of the photodiode is reduced. When the size of a photodiode is reduced by scaling when an image sensor is designed, a pixel characteristic deteriorates.

In order to effectively perform scaling, there is a need for a technique of improving scaling for a photodiode as well as scaling for a readout circuit without deteriorating performance.

According to exemplary embodiments of the present invention, in order to improve a pixel characteristic, the STI region 102 shown in FIG. 1 is not formed, so that a distance between the STI region 102 and the photodiode 100 is not necessary.

Hereinafter, an image sensor according to exemplary embodiments of the present invention will be described with reference to FIGS. 2 to 11.

Figure 2:
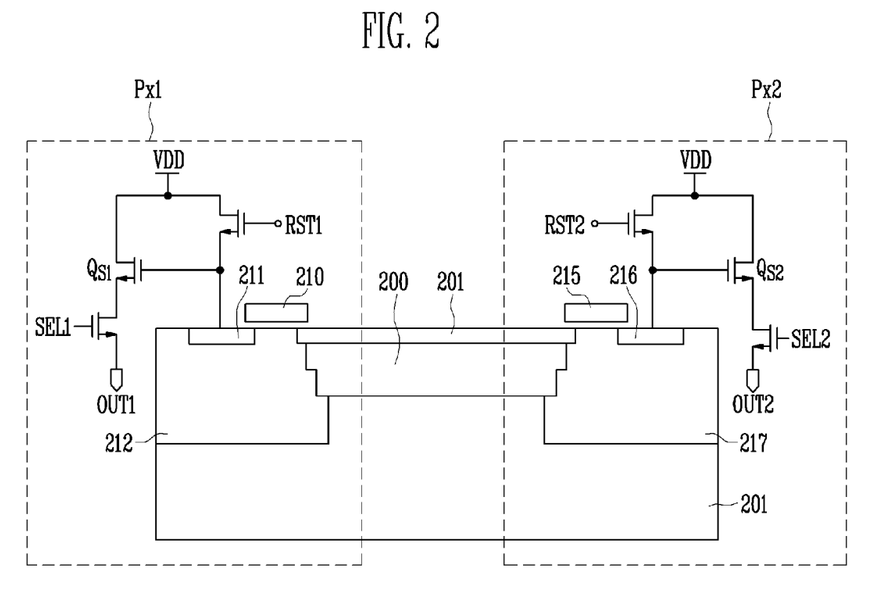
FIG. 2 is a cross-sectional view of an image sensor according to a first exemplary embodiment of the present invention.
Figure 3:
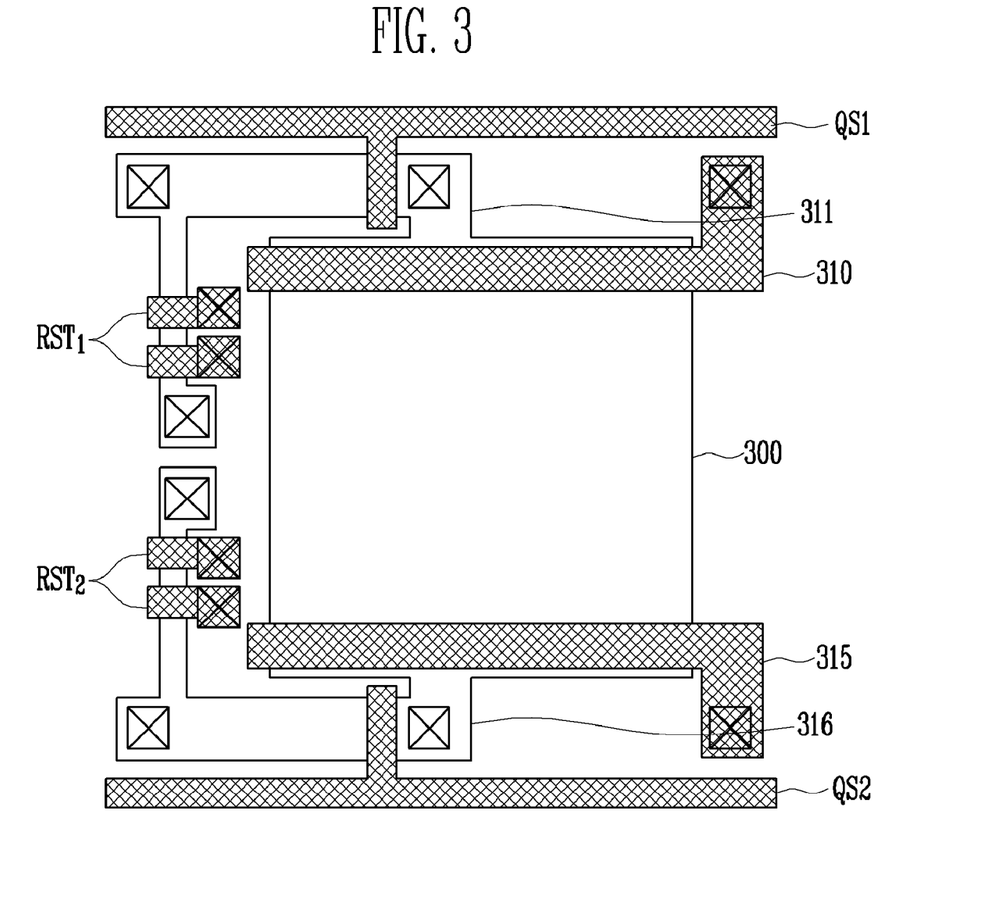
FIG. 3 is a plane view of an image sensor according to the first exemplary embodiment of the present invention.

FIG. 2 is a cross-sectional view of an image sensor according to a first exemplary embodiment of the present invention, and FIG. 3 is a plane view of an image sensor according to the first exemplary embodiment of the present invention.

Referring to FIG. 2, each of unit pixels Px1 and Px2 includes a substrate 201, a photodiode 200, a p+ doped region 201, a diffusion region 211 or 216, and a transfer transistor 210 or 215 as in FIG. 1. Each of signal readout circuits includes a reset transistor QR1 or QR2, a driving transistor QS1 or QS2, and a selection transistor QSEL1 or QSEL2. A configuration of the readout circuits is identical to that shown in FIG. 1.

As shown in FIG. 2, the two adjacent pixels Px1 and Px2 share one photodiode 200 and are disposed symmetrically centering on the photodiode 200.

Therefore, a STI region is not formed between the two pixels Px1 and Px2, and a separation distance between the STI region and the photodiode is not necessary.

Referring to FIG. 3, a photodiode 300 is disposed at a central portion in which two pixels are positioned and is made of one film.

Two transfer transistors 310 and 315 are disposed symmetrically centering on the photodiode 300, and the photodiode 300 is connected to two diffusion regions 311 and 316 through the transfer transistors 310 and 315, respectively.

Terminals which are connected to reset transistors QR1 and QR2 and driving transistors QS1 and QS2 are formed on the diffusion regions 311 and 316, respectively. A configuration of the terminals is not limited to that of FIG. 3.

Various modifications of an exemplary embodiment of the present invention will be described with reference to FIGS. 4 to 6.

Figure 4:
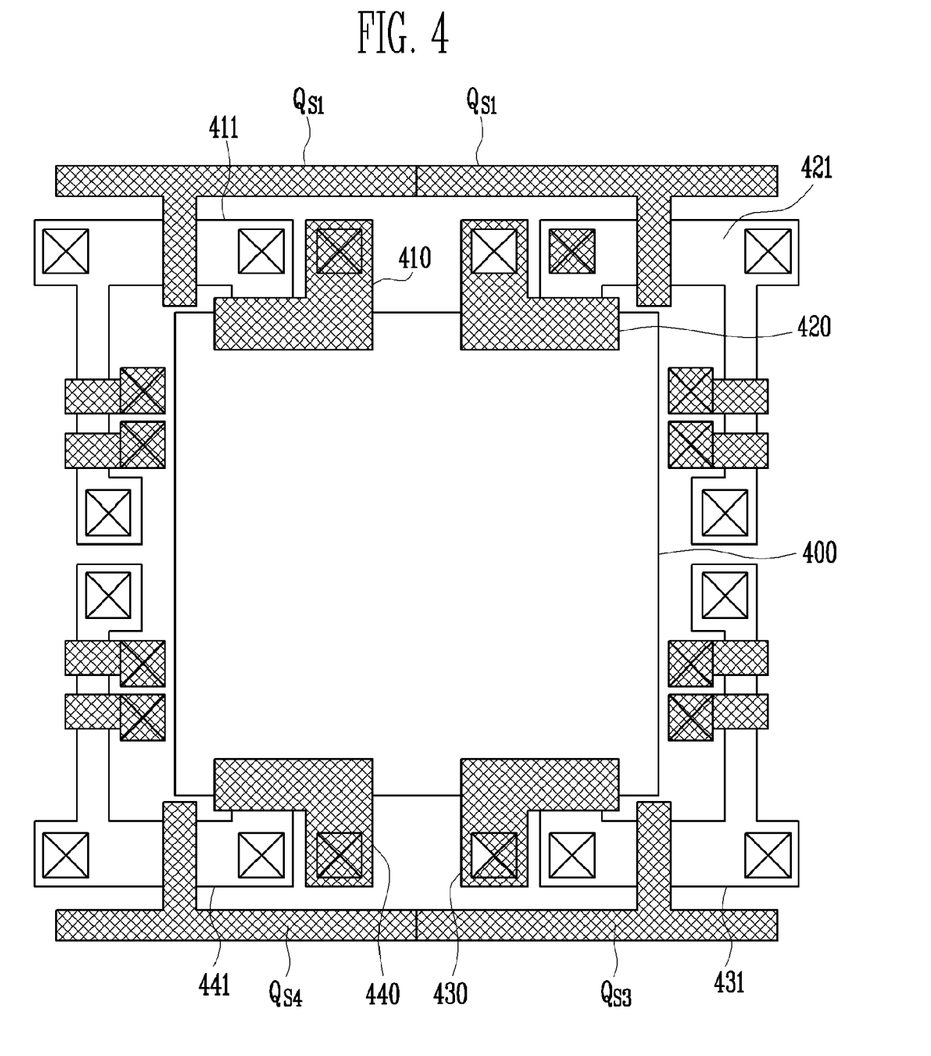
FIG. 4 is a plane view of an image sensor according to a second exemplary embodiment.
Figure 5:
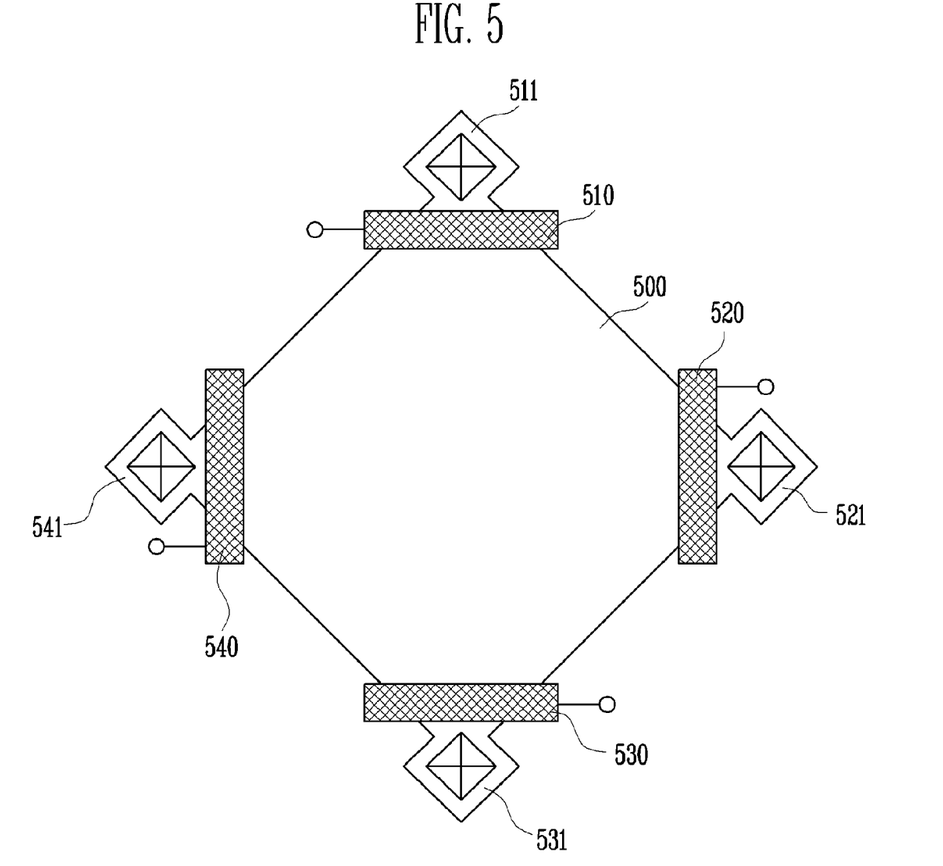
FIG. 5 is a plane view of an image sensor according to a third exemplary embodiment.
Figure 6:
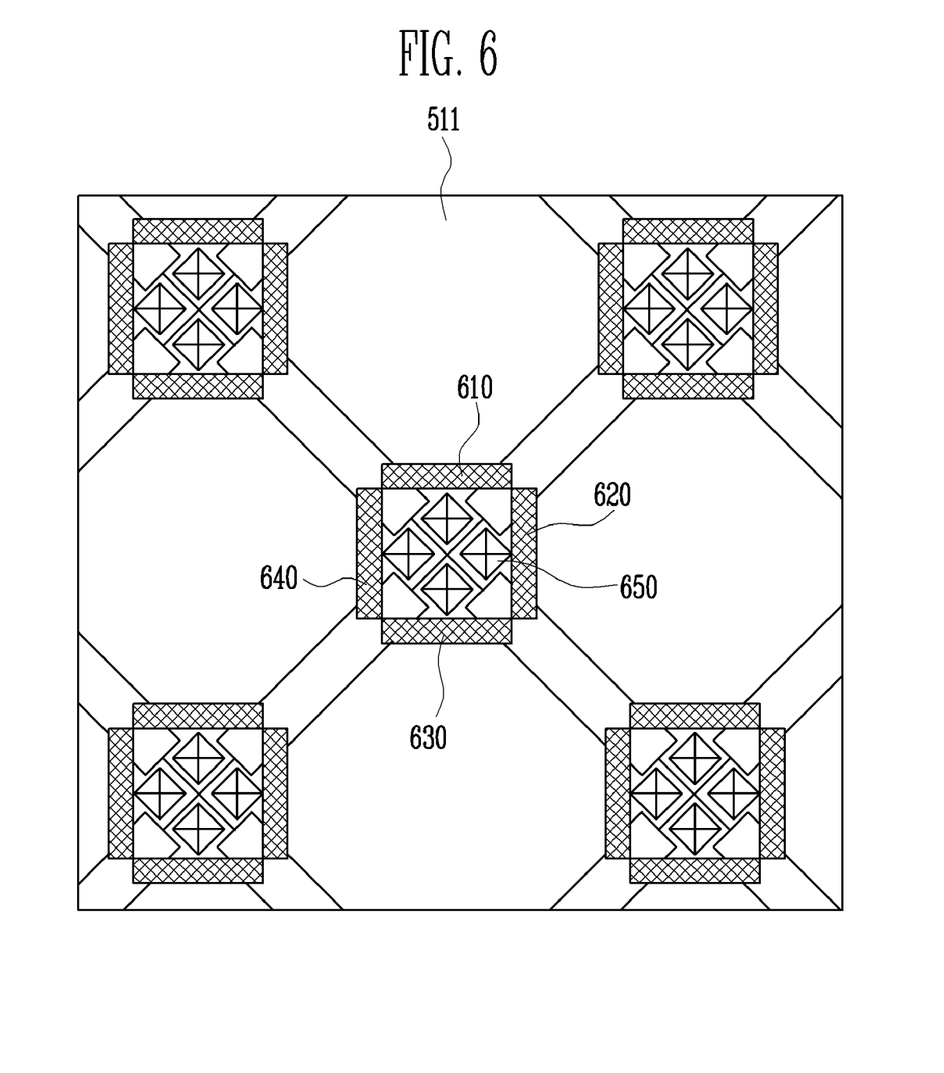
FIG. 6 is an expanded plane view of the image sensor of FIG. 5.

FIG. 4 is a plane view of an image sensor according to a second exemplary embodiment, FIG. 5 is a plane view of an image sensor according to a third exemplary embodiment, and FIG. 6 is an expanded plane view of the image sensor of FIG. 5.

Referring to FIG. 4, one shared photodiode 400 is formed as a photodiode for four adjacent pixels, unlike the structure of FIG. 3 in which the two transfer transistors are disposed. The shared photodiode 400 is formed through one mask region.

It is similar to the structure of FIG. 3, but the shared photodiode 400 is disposed on a region which is assigned to four pixels, and readout circuits are disposed symmetrically centering on the shared photodiode 400.

That is, four transfer transistors 410, 420, 430, and 440 which is can read out a signal of the shared photodiode 400 are disposed at four corners, respectively, and four diffusion regions 411, 421, 431, and 441 are symmetrically disposed to be connected to the shared photodiode 400 through the transfer transistors 410, 420, 430, and 440, respectively.

Referring to FIG. 5, a shared photodiode 500 has a diamond shape. Four transfer transistors 510, 520, 530, and 540 and four diffusion regions 411, 421, 431, and 441 which are symmetrically disposed to be connected to the shared photodiode 400 through the transfer transistors 410, 420, 430, and 440, respectively, are disposed at four corners.

Since the transfer transistors 510, 520, 530, and 540 serve to reset the photodiode 500, in the case of the arrangement of FIG. 5, reset and transfer operations can be effectively performed at both a central portion and an edge portion.

That is, the structure of FIG. 5 is to smoothly perform reset and transfer operations of a large-sized photodiode. Compared to a structure in which a reset operation is performed in only one side, a structure in which reset and transfer operations are performed in four sides more effectively performs reset and transfer operations, whereby a phenomenon such as an image lag is suppressed and it is possible to prevent a noise characteristic of a large-sized photodiode from deteriorating.

In this case, optical signals acquired from the adjacent transfer is transistors 510, 520, 530, and 540 are processed together.

That is, as shown in FIG. 6, optical signals which are read out from different pixels and combined in one corner may be connected through terminals 650 to be processed together through an information processing block. For example, values acquired from adjacent pixels may be added through an information processing block. In this case, a pixel size increases and so resolution decreases, but image quality is improved.

Next, an image sensor which has a shared photodiode and a high resolution will be described with reference to FIGS. 7 and 8.

Figure 7:
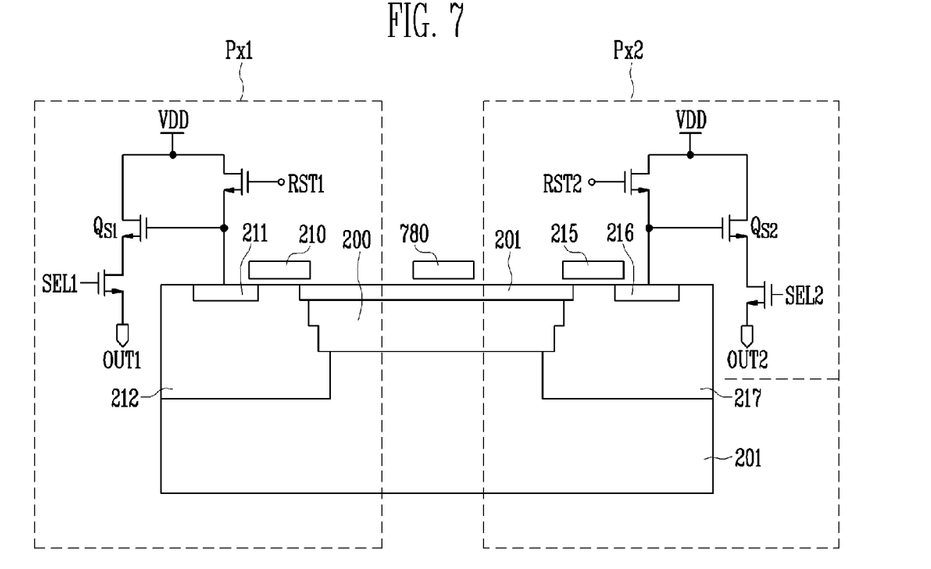
FIG. 7 is a cross-sectional view of an image sensor according to a fourth exemplary embodiment of the present invention.
Figure 8:
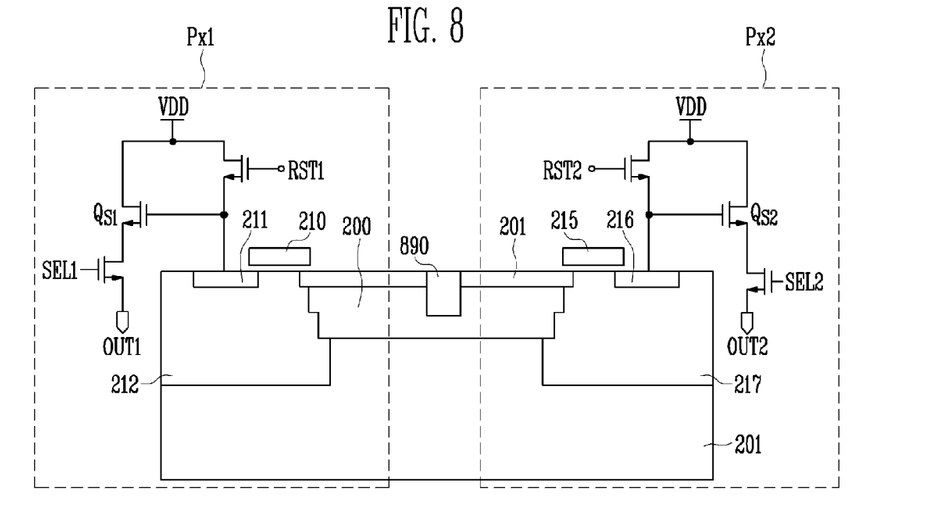
FIG. 8 is a cross-sectional view of an image sensor according to a fifth exemplary embodiment of the present invention.

FIG. 7 is a cross-sectional view of an image sensor according to a fourth exemplary embodiment of the present invention, and FIG. 8 is a cross-sectional view of an image sensor according to a fifth exemplary embodiment of the present invention.

Referring to FIG. 7, in a structure having a shared photodiode illustrated in FIG. 2, a separation wall 780 is formed on a photodiode for effective separation of incident light within one photodiode. The separation wall 780 may be made of a metallic line or a poly wiring.

A voltage is applied to the separation wall 780 to form an energy barrier within the photodiode 200 below the metallic line or the poly wiring, so that the photodiode 200 is separated without a STI region.

FIG. 8 illustrates an embodiment in which, like a surface is implanting region 201, a doped region 890 is formed in a shared photodiode for effective separation of incident light within one photodiode 200.

The depth of the doping region 890 in the shared photodiode may be larger or smaller than the depth of the photodiode 200. In the present embodiment, the doping region 890 is shallower than the photodiode 200.

Figure 9:
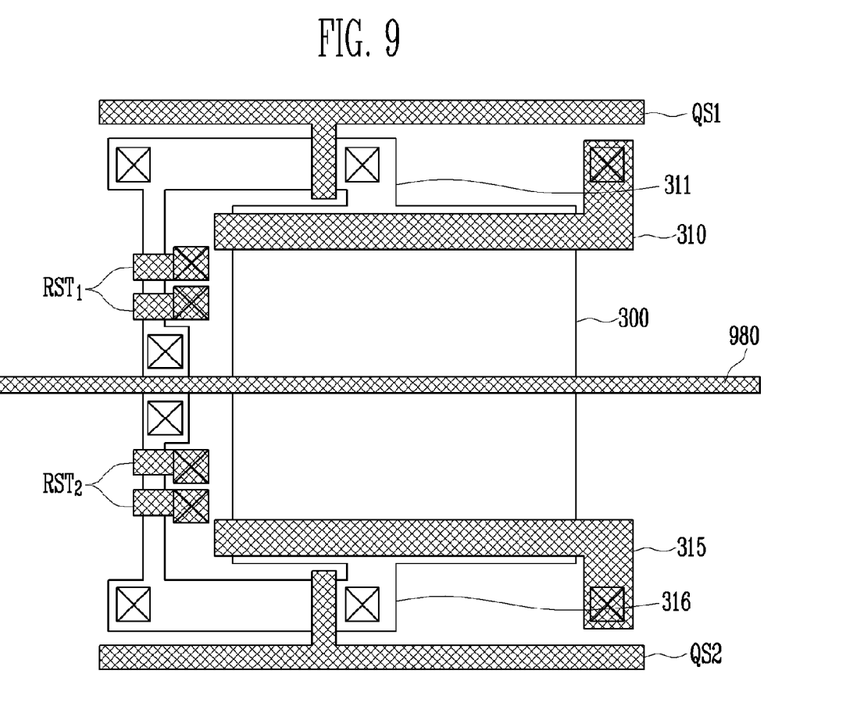
FIGS. 9 to 11 are plane views illustrating image sensors to which the embodiment of FIG. 7 or 8 is applied.
Figure 10:
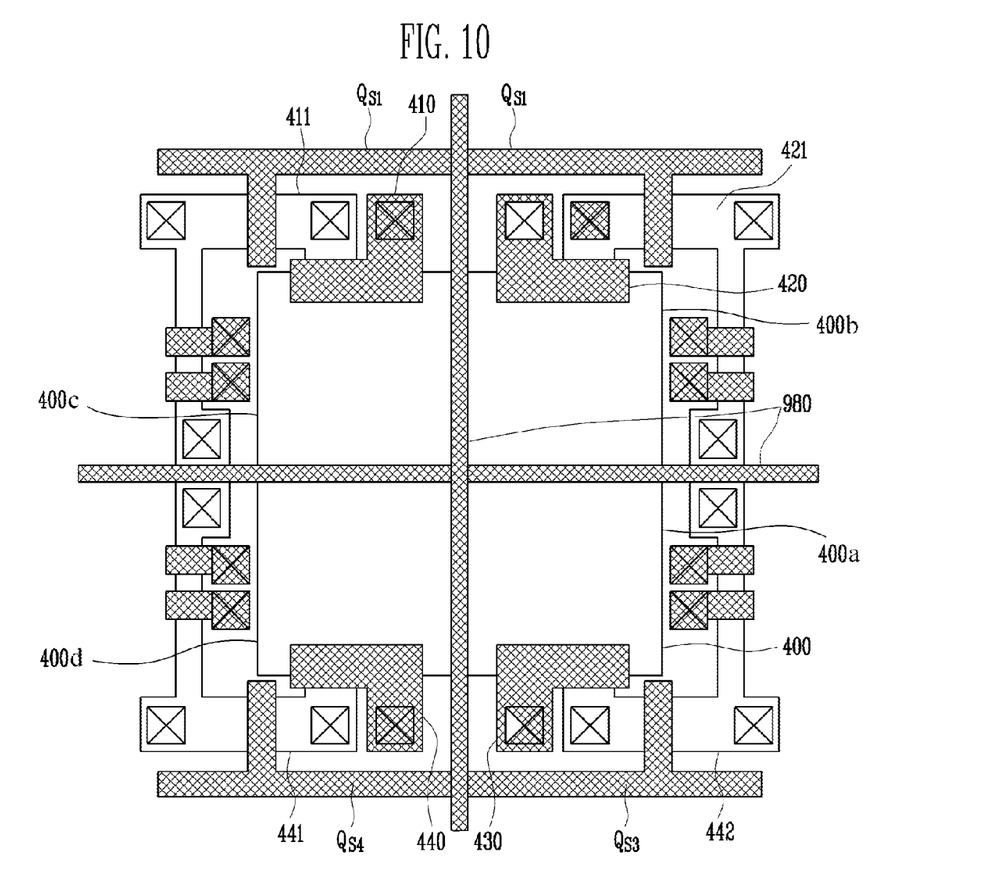
Figure 11:
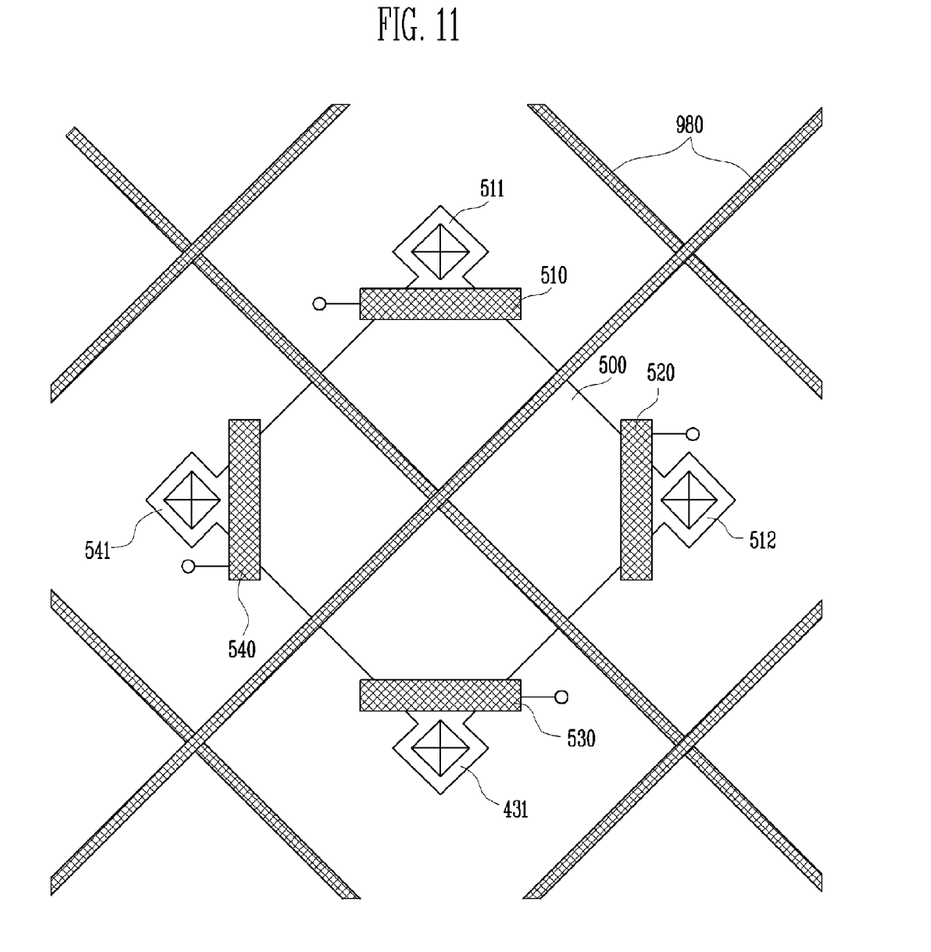

FIGS. 9 to 11 are plane views illustrating image sensors to which the embodiment of FIG. 7 or 8 is applied.

FIG. 9 is a plane view of an image sensor in which the separation wall of FIG. 7 or the doped region of FIG. 8 is applied to the image sensor of FIG. 3, FIG. 10 is a plane view of an image sensor in which the separation wall of FIG. 7 or the doped region of FIG. 8 is applied to the image sensor of FIG. 4, FIG. 11 is a plane view of an image sensor in which the separation wall of FIG. 7 or the doped region of FIG. 8 is applied to the image sensor of FIG. 5.

As shown in FIGS. 9 to 11, since a shared photodiode 300, 400 or 500 is used, a minimum separation distance between a STI region and a pixel is not necessary. A separation wall or a doped region 980 of FIG. 7 or 8 is formed on the shared photodiode 300, 400 or 500. Therefore, a fill factor of the photodiode 300, 400 or 500 is secured, and since adjacent pixels can be simultaneously driven, a detection signal is generated when a turn on signal is simultaneously applied to transfer transistors connected to the shared photodiode 300, 400 or 500, a resolution is improved.

As illustrated in FIG. 10, the shared photodiode 400 includes photodiodes 400a, 400b, 400c, 400d of neighboring unit pixels that are disposed symmetrically to be adjacent to one another so as to form a shared photodiode. The photodiodes 400a, 400b, 400c, 400d may touch each other underneath the separation wall or a doped region 980 as illustrated in the similar embodiment of FIG. 7 where the shared photodiode 200 extends underneath the separation wall 780.

In the exemplary embodiments of the present invention, a photodiode is one embodiment of an optical detector which receives an optical signal and converts it into a photo-electron. The photodiode may be substituted with any other element which can perform a photoelectric conversion.

In the exemplary embodiments of the present invention, a doping type of a dopant may be reversed. Even when a doping type of a dopant is reversed, similar improvements and effects may be obtained.

The exemplary embodiments of the present invention have been described focusing on a silicon substrate, but a different semiconductor substrate, for example, a compound semiconductor substrate, may be used.

As described above, the image sensor according to the exemplary embodiments of the present invention does not have a STI region which causes a dark current restricting its performance and does not require a basic minimum design factor (a distance or an area) related to a STI region. A region corresponding to a STI region may be used as a region of a photodiode or for additional pixel scaling. Therefore, a limitation in scaling of a photodiode is overcome, and pixel performance is improved in spite of pixel scaling.

Further, since a new function may be added according to an operation of a readout circuit of an image sensor with a shared photodiode, functionality of an image sensor is improved.

In addition, reset and transfer operations for a large-sized photodiode are smoothly performed even in a four-transistor pixel structure, and thus a phenomenon such as an image lag is suppressed, and deterioration of image quality resulting from a poor noise characteristic can be prevented.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. An image sensor with a shared photodiode, comprising:
at least two unit pixels, each of which includes a photodiode, a diffusion region which gathers electrons from the photodiode, a transfer transistor which connects the photodiode with the diffusion region, and a readout circuit which reads out a signal from the diffusion region,
wherein photodiodes of neighboring unit pixels from the at least two unit pixels are disposed symmetrically to be adjacent to one another to form a shared photodiode, the photodiodes of the neighboring unit pixels physically touching each other, and a detection signal is generated when a turn on signal is simultaneously applied to the transfer transistors of the neighboring unit pixlels that are connected to the shared photodiode; and a separation wall that forms an energy barrier in the shared photodiode to separate incident light within the shared photodiode.

2. The image sensor of claim 1, wherein transfer transistors of the neighboring unit pixels, with respect to the shared photodiode, are disposed symmetrically centering on the shared photodiode.

3. The image sensor of claim 2, wherein the shared photodiode is formed from the photodiodes of four neighboring unit pixels from the at least two unit pixels that are disposed symmetrically to be adjacent to one another, and the four transfer transistors of the four neighboring unit pixels are disposed symmetrically centering on the shared photodiode.

4. The image sensor of claim 3, wherein the shared photodiode has a diamond shape, and the four transfer transistors are positioned at corner regions of the diamond shape, respectively.

5. The image sensor of claim 3, wherein readout signals from neighboring shared photodiodes are combined to generate one detection signal.

6. The image sensor of claim 5, wherein the one detection signal corresponds to a sum of the readout signals from the neighboring shared photodiodes.

7. The image sensor of claim 1 wherein the separation wall is formed by forming a wiring on the shared photodiode, and the energy barrier is formed when a voltage is applied to the wiring.

8. The image sensor of claim 1, wherein the separation wall is formed by forming an ion-doped region in the shared photodiode.

9. The image sensor of claim 7, wherein the wiring includes a metallic line or a poly wiring.

10. The image sensor of claim 1, wherein the separation wall is a wiring disposed over the shared photodiode, and the energy barrier is formed when a voltage is applied to the wiring.

11. The image sensor of claim 10, wherein the shared photodiode has a first side, a second side opposite the first side and a surface that extends from the first side to the second side, the separation wall having a portion that extends from the first side to the second side, the entirety of the portion being disposed only over the shared photodiode, the portion being on a line that is perpendicular to the surface of the shared photodiode.

12. The image sensor of claim 10, wherein the shared photodiode has a first side, a second side opposite the first side and a surface that extends from the first side to the second side, the separation wall having a first portion that extends from the first side to the second side, the entirety of the first portion being disposed only over the shared photodiode, the first portion being on a line that is perpendicular to the surface of the shared photodiode, wherein the shared photodiode has a third side and a fourth side opposite the third side, the separation wall having a second portion that extends from the third side to the fourth side, the entirety of the second portion being disposed only over the shared photodiode, the second portion being on another line that is perpendicular to the surface of the shared photodiode, and wherein the first portion and the second portion are perpendicular to each other.

13. The image sensor of claim 10, wherein the shared photodiode has a first side, a second side opposite the first side and a surface that extends from the first side to the second side, the separation wall having a portion that extends from the first side to the second side, the entirety of the portion being disposed only on lines that are each perpendicular to the surface of the shared photodiode.

14. The image sensor of claim 10, wherein the shared photodiode includes an ion-doped separation region, and the separation wall forms the energy barrier through the ion-doped separation region.

15. The image sensor of claim 1, wherein the shared photodiode of the neighboring unit pixels is disposed at a center region of the neighboring unit pixels, and the transfer transistors and the diffusion regions of the neighboring unit pixels are disposed at an edge region of the neighboring unit pixels, wherein the transfer transistors and the diffusion regions of the neighboring unit pixels are symmetrically disposed so as to form mirror symmetry in the image sensor.

* * * * *